United States Patent [19]

Hughes

[11] Patent Number: 4,849,759
[45] Date of Patent: Jul. 18, 1989

[54] ANALOGUE TO DIGITAL CONVERTER

[75] Inventor: John B. Hughes, Hove, England

[73] Assignee: U.S. Philips Corp., New York, N.Y.

[21] Appl. No.: 136,031

[22] Filed: Dec. 21, 1987

[30] Foreign Application Priority Data

Dec. 23, 1986 [GB] United Kingdom ............... 8630816

[51] Int. Cl.$^4$ ............................................. H03M 1/14
[52] U.S. Cl. .................................... 341/156; 341/118; 341/127
[58] Field of Search ................ 340/347 AD, 347 CC, 340/347 DA; 341/118, 127, 156, 158, 159, 160, 161

[56] References Cited

U.S. PATENT DOCUMENTS

| | | | |
|---|---|---|---|
| 4,099,173 | 7/1978 | Zeskind et al. | 341/156 |
| 4,352,092 | 9/1982 | Masuda et al. | 340/347 DA |
| 4,380,005 | 4/1983 | Debord et al. | 341/118 |
| 4,410,876 | 10/1983 | Sawagata | 341/156 X |
| 4,468,651 | 8/1984 | Lechner et al. | 340/347 CC |
| 4,544,917 | 10/1985 | Lenhoff, Jr. | 340/347 AD |
| 4,763,107 | 8/1988 | Koen et al. | 340/347 AD |

Primary Examiner—William M. Shoop, Jr.
Assistant Examiner—Marc S. Hoff
Attorney, Agent, or Firm—Bernard Franzblau

[57] ABSTRACT

In a half-flash analogue to digital converter (ADC) for balanced signals, d.c. offset compensation is provided by means of two negative feedback arrangements 510 and 520. A first compensating signal LOFF is the time-average of the output of the middle comparator MC17 of the coarse converter stage and provides compensation of offsets in the most significant bits (MSB) of the output. A second compensating signal COFF is generated by an additional comparator MC34 to effect compensation of offsets re-introduced when a difference amplifier 404 forms the residual signal $V_{LSB}$ for the input to the fine converter stage.

15 Claims, 6 Drawing Sheets

| Fig.1c. | $V_{IN}$ | T | T+1 | T+2 |
|---|---|---|---|---|
| | MSB | T | T+1 | T+2 |
| | LSB | T−1 | T | T+1 |

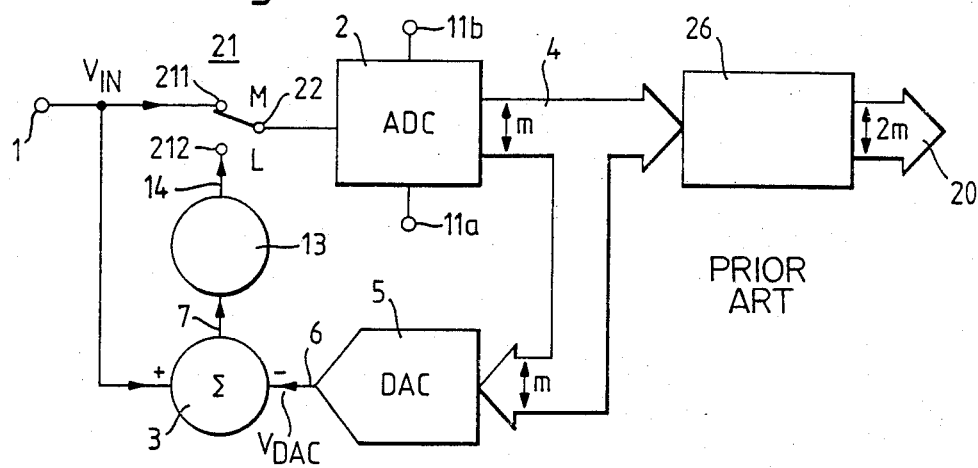
Fig.2a.
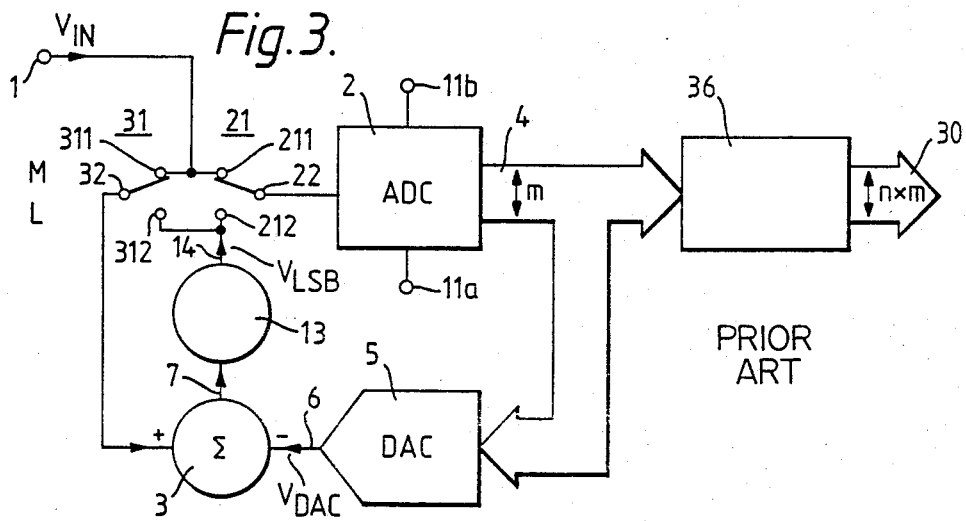
Fig.2b.
| SAMPLE PERIOD | T | | T+1 | | T+2 | |
|---|---|---|---|---|---|---|
| SWITCH POSITION | M | L | M | L | M | L |
| MSB | T | | T+1 | | T+2 | |
| LSB | | T | | T+1 | | T+2 |
Fig.3.

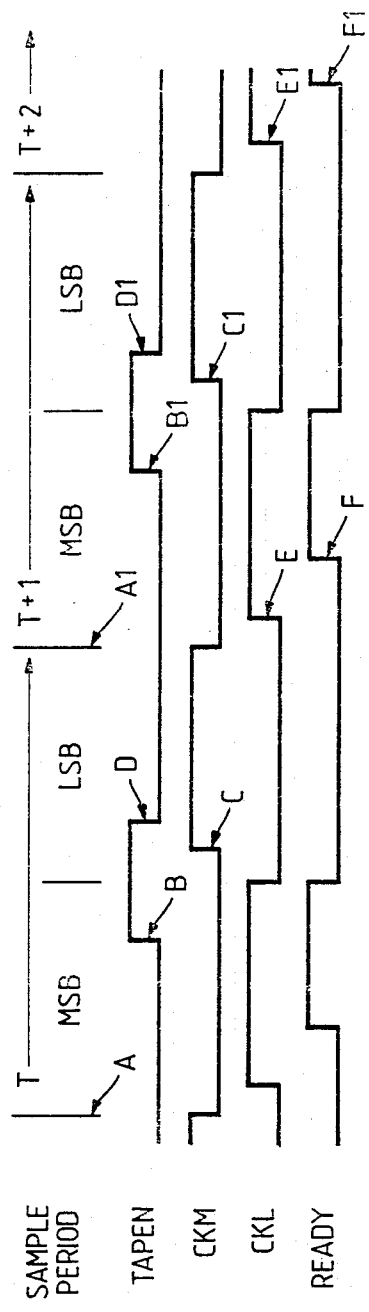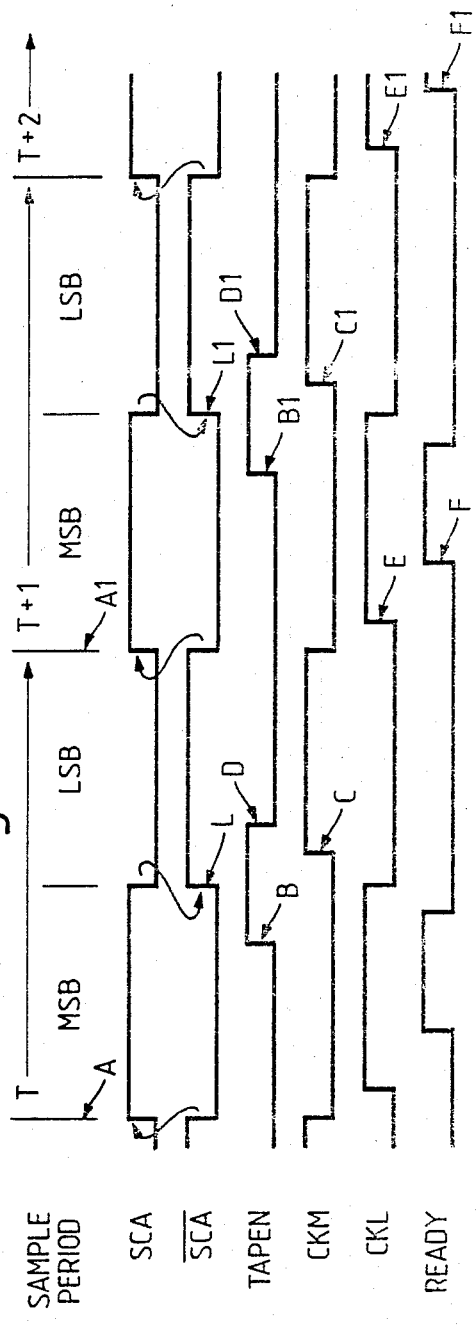

4,849,759

ANALOGUE TO DIGITAL CONVERTER

BACKGROUND OF THE INVENTION

The invention relates to an analog of digital converter (ADC) for signals balanced about a datum level comprising a first ADC stage which comprises an input for receiving a first analog signal, means for generating one or more reference levels, a comparator for each reference level, each comparator operating to compare said first analog signal with its reference level, said first ADC stage also comprising a digital to analog converter for generating at its output a second analog signal which is an analog representation of the digital output of the first ADC stage; means for subtracting said second analog signal from the first analog signal to form a third analog signal; means for applying the third analog signal to the input of a further ADC stage, and means for combining the digital outputs of the ADC stages to form the digital output of the converter.

Such a converter is disclosed in U.S. Pat. No. 4099173 which describes a 2-step or half-flash ADC having two separate ADC stages, each having 7 reference levels and seven comparators.

Half-flash ADC's are part of a broader family or multi-stage flash converters. In operation, each ADC state generates a group of bits of the final output, from a group of the most significant bits (MSB) to the least significant group of bits (LSB), and subtracts the analog value of that group of bits from the input value to generate a residual signal which forms the input to the following stage.

A well know problem with ADC's is that d.c. offset signals may arise within comparators, in reference networks, in the input signal itself or otherwise. These offset errors reduce the accuracy of conversion and so some form of offset compensation is desirable. In subranging converters in particular the problem of offsets can become acute because with the formation of the residual signal, the offset errors can assume magnified proportions in the following stage.

Manual trimming of the ADC components is possible, but is not only laborious but also fails to compensate for offsets present in the input signal, or, more importantly, for changes which invariably occur due to ageing after trimming or in operation, as the result of temperature changes for example.

Automatic offset compensation in a half-flash ADC is known, for example from U.S. Pat. No. 4410876 wherein an accurate reference signal is periodically substituted for the real input signal and converted and stored as an error signal to be added in at the input over the next few samples. The above cited specification relates specifically to an ADC for video signals, and advantage is taken of the naturally occurring blanking periods to perform this calibration. In more general applications, however, the time taken for the extra conversion may be unacceptable.

In many applications, it is known that the signal to be converted is balanced about some fixed level, e.g. ground. In other words, the signal has a fixed mean value. Known examples of balanced signals include line codes for digital data transmission such as the Alternate Mark Inversion (AMI) and WAL2 codes.

U.S. Pat. No. 4380005 discloses an ADC which uses the constant mean level of a balanced input signal to perform a continuous offset compensation. A feedback signal is taken from the sign bit of the digital output, low pass filtered and subtracted from the input signal. However, the ADC disclosed in U.S. Pat. No. 4380005 is of a different type to that claimed in the present application and the problem of magnified offsets in the residual signal does not exist in the ADC disclosed.

SUMMARY OF THE INVENTION

It is an object of the present invention to provide an ADC with automatic offset compensation which mitigates at least some of the disadvantages of existing systems.

The invention provides an ADC as set forth in the opening paragraph, characterised in that said first stage further comprises means for generating a first compensating signal by forming a time-average of the output of the comparator whose reference level corresponds to the datum level, means for subtracting said first compensating signal from the first analogue signal before application to said comparators, means for adding a second compensating signal to the third analogue signal before application to the input of the further ADC stage, and means for generating the second compensating signal. The second compensating signal generating means comprise an additional comparator having the same form as the other comparator(s) of the first ADC stage, having an output connected by means of a negative feedback loop to its inverting input, and having its non-inverting input connected to the datum level.

By generating and applying a first compensating signal as described above, offsets are compensated in the first A/D conversion, but some offset error occurs in the residual signal (third analogue signal). This latter offset error can be shown to be comprised mainly of offsets introduced by the ADC comparators and is compensated by use of the additional comparator and associated feedback loop.

Effective offset compensation not only improves accuracy, but may also relax many constraints upon the designer, as regards choice of technology, production spreads, timing, etc.. The negative feedback loop may comprise a low pass filter connected between the output of the additional comparator and its inverting input. This allows the use of latched output comparators.

The reference level or levels may be voltages generated by means of taps in a resistance chain connected to at least one primary reference level.

The output levels of the digital to analogue converter (DAC) may be derived from the same reference level or levels as are the reference levels of the first ADC stage. The DAC may comprise one or more switches, one switch being connected to each reference level of the first ADC stage and means for selectively operating one of said switches in response to the outputs of the comparators of the first ADC stage. This allows a simple implementation, e.g. on an integrated circuit, and also eliminates the risk of errors caused by mismatch between different sets of reference levels.

Each ADC stage may further comprise means for amplifying the third analogue signal by $2m$, where m i equal to the number of bits in the output of the first ADC stage, to generate the input for the further ADC stage, said further ADC stage operating by comparing the amplified third analogue signal with the same reference level or levels as the first ADC stage.

The further ADC stage or stages may employ multiplexing means for enabling the use of the same reference levels and/or comparators as the the first ADC stage.

Such a serial structure requires fewer components than an equivalent parallel structure, but is not suitable for pipelined operation which will be described later. An ADC having more than two ADC stages may comprise means for generating the first and/or second compensating signals independently for each ADC stage.

BRIEF DESCRIPTION OF THE DRAWINGS

Embodiments of the invention will now be described, by way of example, with reference to the accompanying drawings, in which:

FIG. 1c is a timing diagram for the ADC's of FIG. 1a and FIG. 1b;

FIG. 2a is a block diagram of a known structure for a serial type (m+n)-bit half-flash ADC;

FIG. 2b is a timing diagram for the ADC of FIG. 2a;

FIG. 3 is a block diagram of a known structure for a n-stage serial-type subranging ADC;

FIG. 4b shows certain waveforms occurring within the ADC of FIG. 4a during operation;

FIG. 5 shows the generation of offset compensation signals in the ADC of FIG. 4a;

FIG. 6b shows certain waveforms occurring within the ADC of FIG. 6a during operation.

DESCRIPTION OF THE PREFERRED EMBODIMENTS

Figure 1A:
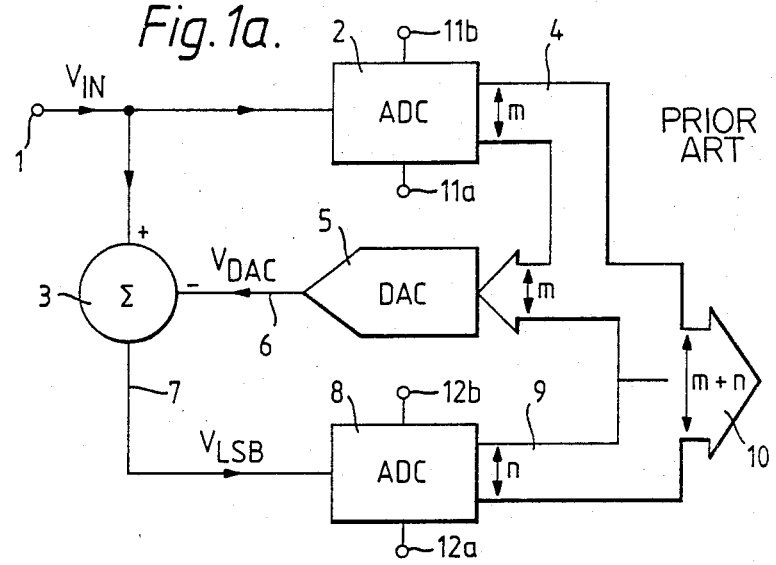
FIG. 1a is a block diagram of a first known structure for a parallel-type (m+n)-bit half-flash ADC.

In FIG. 1a, an analogue input terminal 1 is connected to the input of a first m-bit flash ADC, or MSB converter 2, and also to a first input (+) of a subtractor 3. The output 4 or MSB converter 2 is connected to the input of an m-bit DAC 5. The output 6 of the DAC 5 is connected to a second input (−) of subtractor 3. The output 7 of subtractor 3 is connected to the input of a second flash ADC, or LSB converter 8, whose n-bit output 9 is combined with the m-bit output 4 of MSB converter 2 to form the (m+n) bit output 10. The MSB converter 2 has two reference terminals 11a, 11b and the LSB converter 8 has two reference terminals 12a and 12b.

Figure 1B:
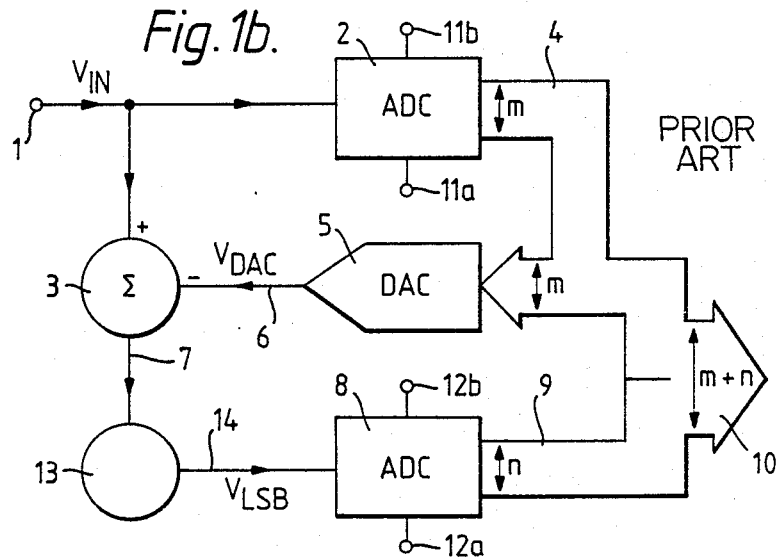
FIG. 1b is a block diagram of a second known structure for a parallel-type (m+n)-bit half-flash ADC.

The circuit of FIG. 1b is similar to that of FIG. 1a, the differences being that the output 7 of subtractor 3 is not connected to the input of LSB converter 8, but to the input of a scaler 13 having a gain of $2^m$. The output 14 of the scaler 13 is connected to the input of LSB converter 8.

In operation, for both circuits, the analogue input signal VIN is applied to input terminal 1 and hence to the input of MSB converter 2, which generates at its output 4 the m most significant bits (MSB) of the digital output.

DAC 5 generates at its output 6 an analogue representation VDAC of the MSB, which is subtracted in subtracter 3 from VIN to generate a residual signal VIN−VDAC at its output 7. This is applied, either directly (FIG. 1a) or via scaler 13 (FIG. 1b), as VLSB to the input of the LSB converter 8. The n least significant bits (LSB) of the digital output word ar thus generated at LSB converter output 9, and the full (m+n) bit output word is available at output 10.

Each converter 2.8 is supplied with a pair of reference levels via reference inputs 11a, 11b, 12a, 12b, which define the range of analogue values to be converted.

Each reference level pair may be, for example, a pair of reference voltages or currents, or a combination of both, according to the requirements of the particular implementation.

In FIG. 1a, the range of residue signal $V_{LSB}$ is $2^m$ times smaller than the range of VIN, and so the reference levels applied to reference inputs 12a and 12b of converter 8 must define a range $2^m$ times smaller than those applied to inputs 11a and 11b of converter 2.

In FIG. 1b, the scaler 13 amplifies the residue so that $VLSB = 2^m \times (VIN - VDAC)$, allowing the same reference levels to be applied to both converters 2 and 8. In either case, it may be convenient to incorporate a level shifter into scaler 13 or subtractor 3, to suit the reference levels chosen.

The timing diagram of FIG. 1c shows how the parallel structures of FIGS. 1a and 1b allow a sample rate as high as a full flash converter, using the technique known as "pipelining". The successive sample periods are identified by T, T+1, T+2 etc. The top two lines of the diagram show that the MSB conversion is performed on each sample as it arrives. Rather than wait for the LSB conversion to be completed before taking a new sample, the circuit generates and stores the residue VLSB, and the MSB for sample T is stored. The MSB converter 2 is already generating the MSB for sample T+1 while the LSB converter 8 finds the LSB for sample T, to complete the conversion.

Thus the sample throughput rate is substantially that of a full flash converter, even though each individual sample takes two sample periods to convert. The converters of FIGS. 1a and 1b are said to have a parallel type structure because a physically separate flash ADC is provided for each conversion stage.

FIG. 2a shows a serial structure half-flash ADC having an input terminal 1 connected to a first contact terminal 211 of a changeover switch 21, and to a first (+) input of subtractor 3. The pole terminal 22 of changeover switch 21 is connected to the input of an m-bit flash ADC 2, whose m-bit output 4 is connected to the inputs of latches 26, and to the input of a DAC 5. The output 6 or DAC 5 is connected to a second (−) input of subtractor 3, whose output 7 is connected to the input of a scaler 13 having a gain of $2^m$. The output 14 of scaler 13 is connected to a second contact terminal 212 of changeover switch 21. Latches 26 have $2^m$ outputs which form the 2m-bit output 20.

Operation is similar to that of FIG. 1b except that in this serial structure, the single converter 2 is made to generate both the MSB and the LSB in turn, by operating switch 21 to be in the positions M and L respectively. Latches 26 hold the MSB for each sample until the LSB are ready, and both are produced together at 2m-bit output 20.

Timing diagram FIG. 2b illustrates that pipelining is not possible for serial-type half-flash ADC's because the sole ADC 2 must perform both the MSB and LSB conversions in turn, and operation is consequently slower than for the pipelined scheme of FIG. 1c.

Although for simplicity the ADC's described hereinafter as particular embodiments of the invention are half-flash or 2-step structures like those of FIGS. 1 and 2, it will be understood that the offset compensation scheme of the invention is equally suitable for use in subranging ADC's of parallel or serial type having 3 or more stages.

Such structures are well-known in the art, but a 3-step converter may, for example, comprise an arrangement as described hereinbefore with reference to FIG. 1b, wherein the second ADC 8 is itself a 2-step ADC as described. In fact any general n-stage converter can be built up in this fashion, having perhaps nxm bits, or $m_1+m_2+\ldots m_n$ bits.

In the most extreme case, an n-bit ADC may be implemented using n 1-bit stages, at the expense of a longer conversion time.

FIG. 3 shows a modification of the serial structure of FIG. 2b to allow more than 2 stages of conversion. Instead of connecting input terminal 1 directly to the first (+) input of subtractor 3 it is connected to a first contact terminal 311 of a second changeover switch 31, the pole 32 of changeover switch 31 then being connected to said first (+) input of subtractor 3. A second contact terminal 312 of switch 31 is connected to the output 14 of scaler 13. Latches 26 are replaced by latches 36, which have nxm outputs, available at output 30.

Switch 31 allows the residue to be derived from the analogue input to the previous stage, whether that be VIN, for the second stage of conversion, or VLSB for all subsequent stages. Latches 36 accumulate the full nxm-bit output word over the n stages of conversion.

Such converters are known and the offset compensation technique described herein may also be applied to these converters. Again, an extreme case exists where m=1.

Figure 4A:
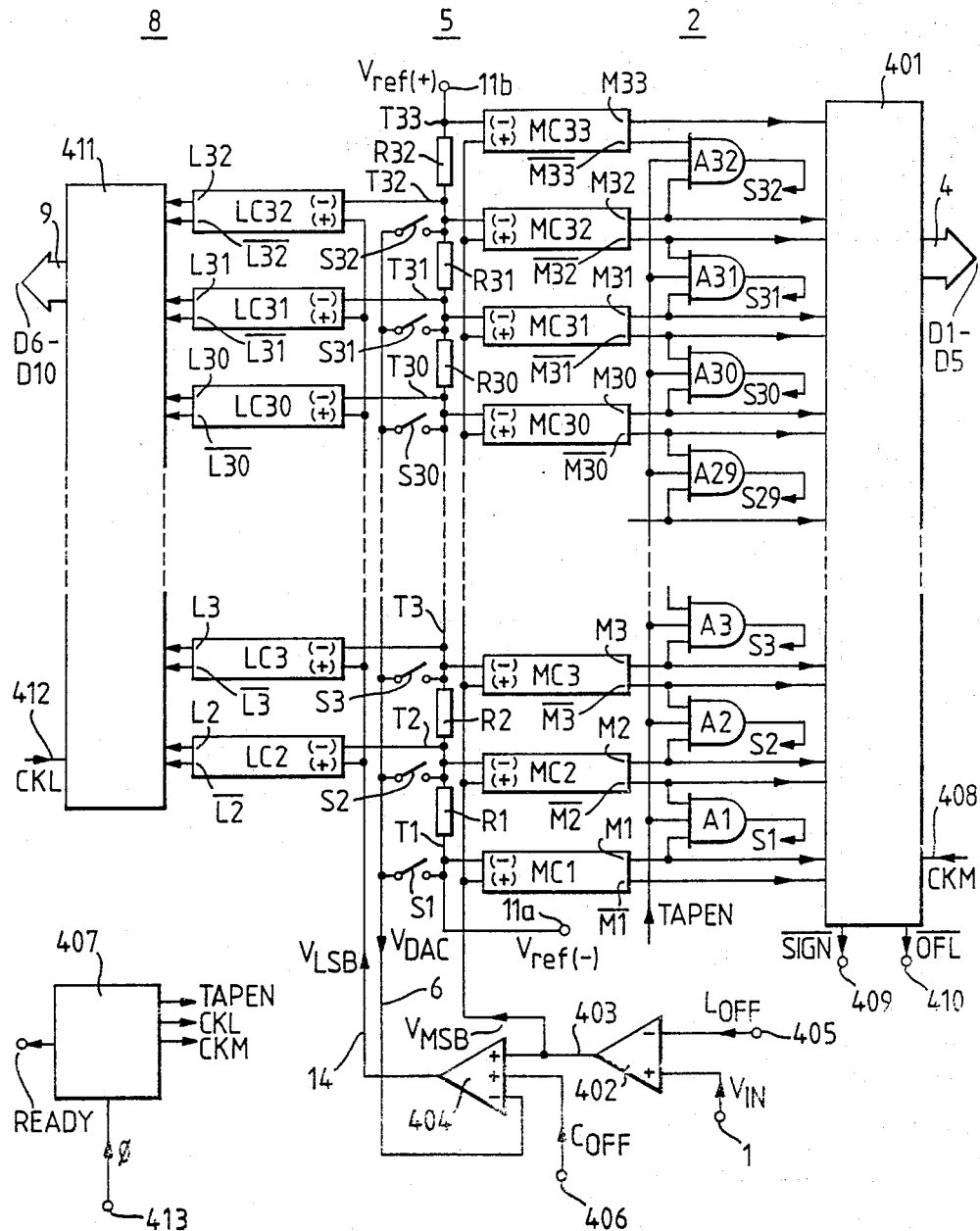
FIG. 4a is a block schematic diagram of a parallel-type, 10-bit half-flash ADC according to the invention.

FIG. 4a is a block schematic diagram of a 10-bit, parallel-type half-flash ADC according to the invention. The basic structure is equivalent to that of FIG. 1b, with m=n=5. A reference chain comprises 32 equal value resistors R1-R32 connected in series between reference terminals 11a and 11b. Taps T1-T33 are provided for connection to terminal 11a, the 31 points between the resistors R1-R32, and terminal 11b respectively. An MSB array of comparators MC1-MC33 is provided, each comparator MCk having an inverting input (−) connected to the corresponding tap Tk, and having complementary outputs Mk and $\overline{Mk}$ which are connected to corresponding inputs of an MSB decoder 401. Decoder 401 has a latched five-bit output, the MSB output 4, further outputs 409 and 410, and a clock input 408, which is connected to an output CKM of control logic 407. Analogue input terminal 1 is connected to a non-inverting input (+) of unity-gain input buffer 402 whose output 403 is connected to non-inverting inputs (+) of the comparators MC1-MC33. The reference chain R1-R32, comparators MC2-MC32 and the MSB decoder 401 together are equivalent to the MSB converter 2 of FIG. 1b. The buffer output 403 is also connected to a first non-inverting input (+) of amplifier 404, which has a gain of $2^m$, which in this example is equal to thirty-two.

A terminal 405 is connected to an inverting input (−) of buffer 402, and a terminal 406 is connected to a second non-inverting input (+) of amplifier 404. These terminals form part of offset compensating loops 510 and 520 respectively, which are not shown in FIG. 4a for clarity, but will be described later with reference to FIG. 5.

Each one of taps T1-T32 is connected to a first terminal of the corresponding one of tap select switches S1-S32. The switches S1-S32 are operable individually in response to the outputs of corresponding AND gate A1-A32. Each AND gate Ak has a first input connected to the output Mk of the corresponding comparator MCk, and a second input connected to the complementary output $\overline{M(k+1)}$ of comparator MC(k+1). Third inputs of all and gates A1-A32 are connected to an output TAPEN of control logic 407. The reference chain R1-R32, the switches S1-S32 and the AND gates A1-A32 together are equivalent to the DAC 5 of FIG. 1b. The second terminals of the switches S1-S32 are commoned to form the DAC output 6, which is connected to an inverting input (−) of amplifier 404.

The output 14 of amplifier 404 is connected to non-inverting inputs (+) of LSB comparators LC2-LC32. The comparator outputs L2-L32 and $\overline{L2}$-$\overline{L32}$ are connected to corresponding inputs of an LSB decoder 411, which has a 5-bit LSB output 9 and a clock input 412 connected to an output CKL of control logic 407. An inverting input (−) of each comparator LCk (k=2,3, ...32) is connected to the corresponding tap Tk of the reference chain. LSB comparators LC2-LC32, LSB decoder 411 and the reference chain together are equivalent to the LSB converter 8 of FIG. 1b.

A master clock input terminal 413 is connected to an input of control logic 407, which has an output READY in addition to the outputs CKM, CKL and TAPEN already mentioned.

In operation, a master clock signal $\phi$ is applied to terminal 413, and control logic 407 generates timing signals at its outputs CKM, CKL, TAPEN and READY as shown in the waveform diagrams of FIG. 4b. Control logic 407 may also generate any other timing signals which may be required by the particular circuit technology employed to construct the ADC. Switched-capacitor circuits, for example require multiphase and/or complementary clock signals.

A sample and hold circuit, (not shown) is used to apply successive samples VIN(T), VIN(T+1) etc. of an unknown analogue input signal VIN(t) to input terminal 1. It should be noted that the sampled nature of the signals in this circuit is not essential to the offset compensation technique of the present invention, but is commonly a feature of practical ADC's which are required to convert rapidly changing input signals.

Reference voltages Vref(+) and Vref(−), which are nominally symmetrical about a fixed reference voltage, e.g. zero volts, are applied to reference terminals 11a and 11b respectively, causing thirty-three equal-spaced reference potentials VT(1)-VT(33) to be applied via taps T1-T33 to the inverting inputs (−) of the corresponding comparators MC1-MC33 and LC2-LC32.

First and second offset compensating signals LOFF and COFF are applied to terminals 405 and 406, respectively, and are generated by means to be described later with reference to FIG. 5. For the present they may be assumed to be at zero volts, and the circuit then operates as a conventional half flash ADC.

As described briefly hereinbefore with reference to FIG. 1, such an ADC allows a high sample rate by means of pipelining. A practical implementation of the circuit of FIG. 4a using, for example, switched-capacitor circuit elements may be constructed for pipelined operation, but to describe such a circuit it would be necessary to consider the steps in the conversion process in more detail than is required for an explanation of the present invention, and so only non-pipelined operation will be described. To that end, FIG. 4b is a simple waveform diagram which shows the states of signals TAPEN, CKM, CKL and READY, as generated at the corresponding outputs of control logic 407, relative to the sample periods T, T+1, etc. Reference letters A to F will be used in the following description to refer to the events indicated on the diagram.

At time A, analogue input sample VIN(T) is applied to input terminal 1 and VMSB=VIN(T) is generated at the output 403 of input buffer 402. The MSB comparators MC1-MC33 compare VMSB with tap voltages VT(1)-VT(33) to generate lathed, valid outputs at M1-M33 and $\overline{M1}$-$\overline{M33}$ by time B. MSB decoder 401 uses the signals at M2-M32 and $\overline{M2}$-$\overline{M32}$ to generate a 5-bit binary value for the MSB, D1-D5. CKM goes high at time C, causing D1-D5 to be latched onto the MSB output 4, thereby completing the MSB conversion At the same time, the outputs of comparators MC1 and MC33 indicate the out-of-range conditions VMSB Vref(−) and VMSB Vref(+) respectively. These are used by decoder 401 to generate a signal $\overline{OFL}$ at output 410.

Also, the tap voltage VT(17) is ideally at the fixed reference voltage midway between the reference voltages applied to terminals 11a and 11b, e.g. zero volts, and the output of comparator MC17 is used by decoder 401 to generate a signal $\overline{SIGN}$=0 on output 409 when VIN is less than the fixed reference voltage, e.g. negative. For the purpose of the following description, the fixed reference voltage will be assumed to be zero volts.

At time B, clock TAPEN goes high, to enable the DAC 5, which then operates as follows. If analogue signal VMSB lies between adjacent tap voltages VT(k) and VT(k+1), then comparator outputs M1 to Mk are set to state '1' and comparator outputs M(k+1) to M33 are set to state '0'. The required value for VDAC is in fact VT(k), and AND gate Ak detects neighbouring comparator MCk and MC(k+1) having dissimilar outputs by use of the Mk and $\overline{M(k+1)}$ outputs of the comparators and closes switch Sk so that VDAC becomes VT(k), as required and is available at DAC output 6.

The functions of subtractor 3 and scaler 13 in FIG. 1b above are combined in the amplifier 404 which generates residual signal VLSB at its output 14. It should be noted, however, that at time D, TAPEN falls to '0', and VDAC no longer appears at the DAC output 6, and so amplifier 404 incorporates means for storing the value of VDAC at time D until the difference VMSB−VDAC has been found. Similarly, the compensating signal COFF may not be available continuously, for example in a switched-capacitor implementation, and means are provided to make COFF available at the appropriate time.

VMSB−VDAC is unipolar, so to use the full, bipolar input range of the LSB converter 8, the amplifier 404 operates with reference to Vref(−), and not ground. Thus (assuming COFF=OV as stated above) VLSB=32x(VMSB−VDAC)+Vref(−), where Vref(−) has a negative value.

LSB converter 8 operates in a similar manner to that of the MSB converter 2, except there is no LSB comparator LC1 and LC33 because overflow of VLSB cannot occur if VMSB is within range. LSB decoder 411 generates the 5-bit binary LSB value as signals D6-D10, which are latched at time E onto LSB output 9, when CKL goes high.

At time F, output READY goes high to indicate that conversion is complete and that the 10-bit output signal D1-D10 is available via outputs 4 and 9 together. By this time, the MSB conversion for sample T+1 has already begun, at time A1.

References A1 to F1 represent the events corresponding to reference A to F, but during sample period T+1.

DC offsets exist for various reasons at various parts of the circuit of FIG. 4a, but they can be lumped for modelling purposes into an input offset error, Vi, a comparator offset error Vc, and a tap offset error Vt. FIG. 5 shows part of the circuit of FIG. 4a, representing these offsets by means of the imaginary voltage sources Vi, Vc and Vt, placed at the analogue input 1, at the non-inverting inputs (+) of the comparators MC1-MC-X and at the taps T1-T33 respectively, as shown.

Figure 5:
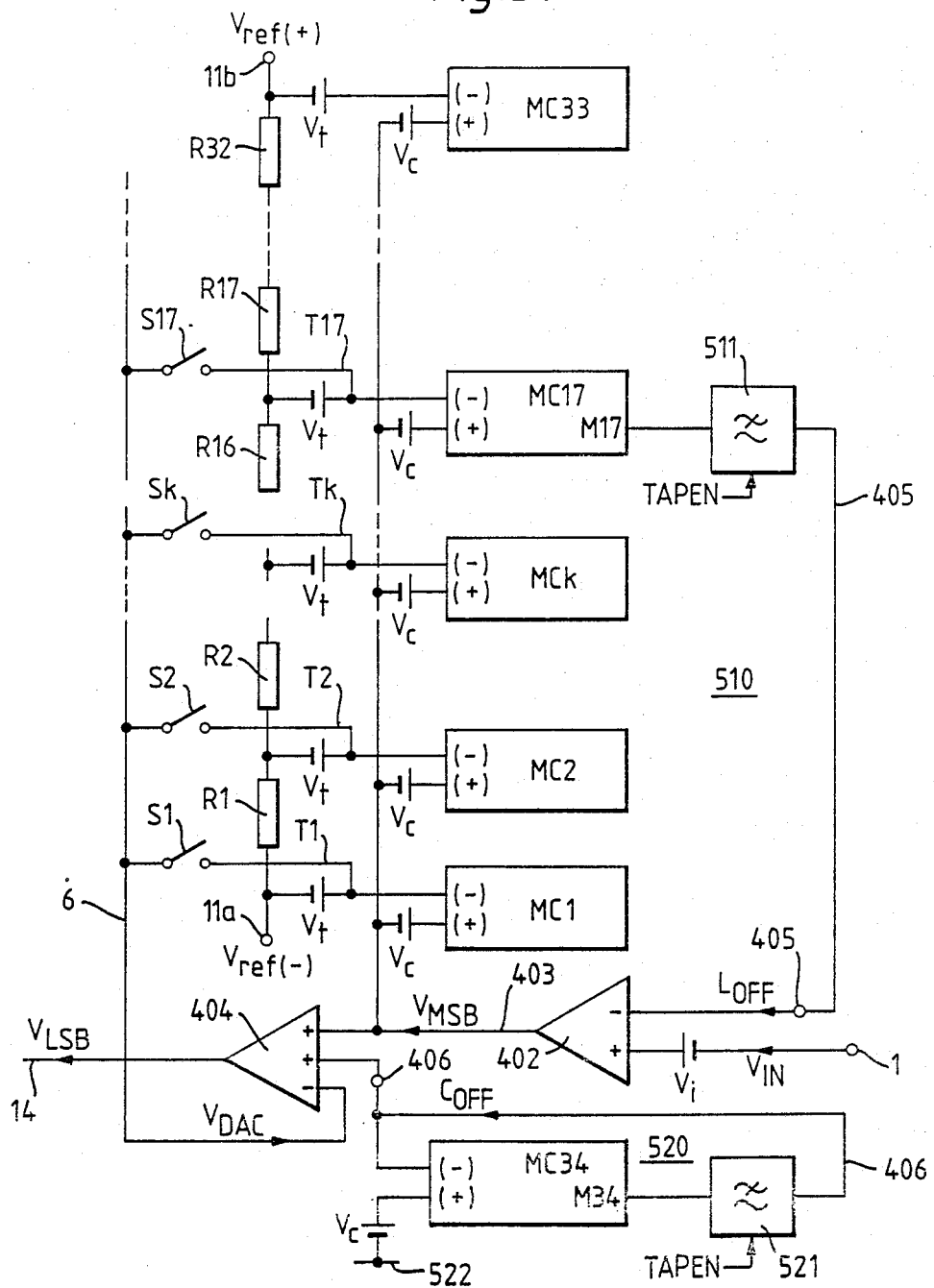

The offset compensating voltages LOFF and COFF are generated and applied to terminals 405 and 406, respectively by means of two negative feedback loops, 510 and 520, as shown in FIG. 5.

The first loop is the MSB loop 510 and comprises the mid-point comparator MC17 of the MSB converter 2, a first low-pass filter 511 and input buffer 402. The output M17 of comparator MC17 is connected to the input of the filter 511, which input in the present embodiment is enabled only when output TAPEN of control logic 407 (FIG. 4a) is high. The output of filter 511 is connected to terminal 405 and is thus connected to the inverting input (−) of input buffer 402.

The second loop is the LSB loop 520 and comprises a comparator MC34 and a second low-pass filter 521. Comparator MC34 has a non inverting input (+) connected to ground at 522. The comparator MC34 is designed to be as nearly identical as possible to those of the MSB array MC1-MC33, and so comparator offset error Vc is present and represented by the imaginary voltage source Vc at 522.

The output M34 of comparator MC34 is connected to the input of filter 521, which input is also enabled only when TAPEN is high. The output of filter 521 is connected to terminal 406 and also to the inverting (−) input of comparator MC34.

The connection between comparator output M17 and filter 511 input (and similarly between M34 and filter 521 input) is such that, by means of enabling signal TAPEN, the filter 511 (521) samples the 0's and 1's of the comparator output M17 (M34), and forms a time average signal LOFF (COFF) which is at zero volts when the samples of M17 (M34) divide equally into 1's and 0's. The time constants of the filters 511 and 521 are chosen according to the nature of the input signal VIN(t), but will at any rate be many times longer than the sample period.

During operation of the converter described above with reference to FIG. 4, the loops 510 and 520 act continuously to compensate dc offsets, provided that the input signal VIN(t) is (or rather is intended to be) balanced about a known reference level, e.g. $\overline{VIN}$=Ov.

The operation of the MSB loop 510 is as follows. The tap T17 is nominally at zero volts (ground) but assymmetry of the reference voltages Vref(+) and Vref(−) gives rise to the offset error Vt. The comparator offset error VC may arise from static mismatch of the comparator input transistors or, if a switched capacitor configuration is used, from charge pumping. The input offset Vi is that introduced from external circuits or the input buffer 402. If all of these errors were zero, then because the input signal VIN is balanced the comparator output M17 would produce '1's and '0's with equal probability. The low pass filter 511 output LOFF would then be at ground. With finite error voltages the loop stabilises when LOFF produces the same average voltage at the (+) input of comparator MC17 as the tap voltage connected to its (−) input. These input voltages v(−) and v(+) are given by $$v(+) = VT(17) + Vt = Vt \text{ (since } Vt(17)=0)$$

and $$v(+) = Vi - LOFF + Vc \text{ (since VIN}=0 \text{ on average)}$$

The loop stabilises with v(−)=v(+)
Therefore $$LOFF = Vi + Vc - Vt \quad (1)$$

and the input buffer 402 output is given by $$VMSB = VIN + Vi - LOFF$$

by subtitution of (1):

$$VMSB = VIN + Vt - Vc \quad (2)$$

The input voltage VIN has an associated tap voltage VT(k) such that $$VT(k+1) > VIN > VT(k)$$

The MSB commmparator connected to Tk is MCk and its input voltages are v(+)k and v(−)k where $$v(+)k = VMSB + Vc$$

by substitution of (2):

$$v(+)k = VIN + Vt \quad (3)$$

and $$v(-)k = VT(k) + Vt \quad (4)$$

The comparison made by comparator MCk is $$v(+)k - v(-)k = VIN - VT(k) \quad (5)$$

Clearly, (5) shows a comprison which would have been made in an ideal conversion, i.e. the offset voltages have been compensated in the MSB conversion.

The analogue residue which is to generate the LSB's is formed by subtracting an analogue replica of the MSB's from the input voltage. In a practical ADC the only signals available for this subtraction are VMSB and VDAC where $$VMSB = VIN + Vt - Vc \quad \text{from (2)}$$

and $$VDAC = VT(k) + Vt \quad (6)$$

Clearly, simple subtraction would propagate errors into the LSB conversion and so extra compensation is needed. This is performed by the second negative feedback loop, the LSB loop 520.

Similarly to the MSB loop, stability is reached when the average input to the (−) input of the comparator MC34 is equal to the input voltage on the (+) input. In this way $$COFF = Vc \quad (7)$$

The voltage supplying the LSB array including the level shift performed by amplifier 404, VLSB, is given by $$VLSB = 32(VMSB + COFF - VDAC) - |Vref(-)|$$

Substitute (2), (6) and (7):

Therefore $$VLSB = 32(VIN + Vt - Vc + Vc - VT(k) - Vt) - |Vref(-)|$$

Therefore $$VLSB = 32(VIN - VT(n)) - |Vref(-)| \quad (8)$$

Given that the LSB conversion above takes place with reference to the same Vref(−), the level shift is not a source of any substantial error, and equation (8) confirms that with the compensation described the analogue voltage residue for conversion in the LSB array is substantially free from offset voltage errors. Of course, further offset voltages will exist in the LSB array but they are 32 times less significant than similar errors in the MSB array and can usually be neglected.

Figure 6A:
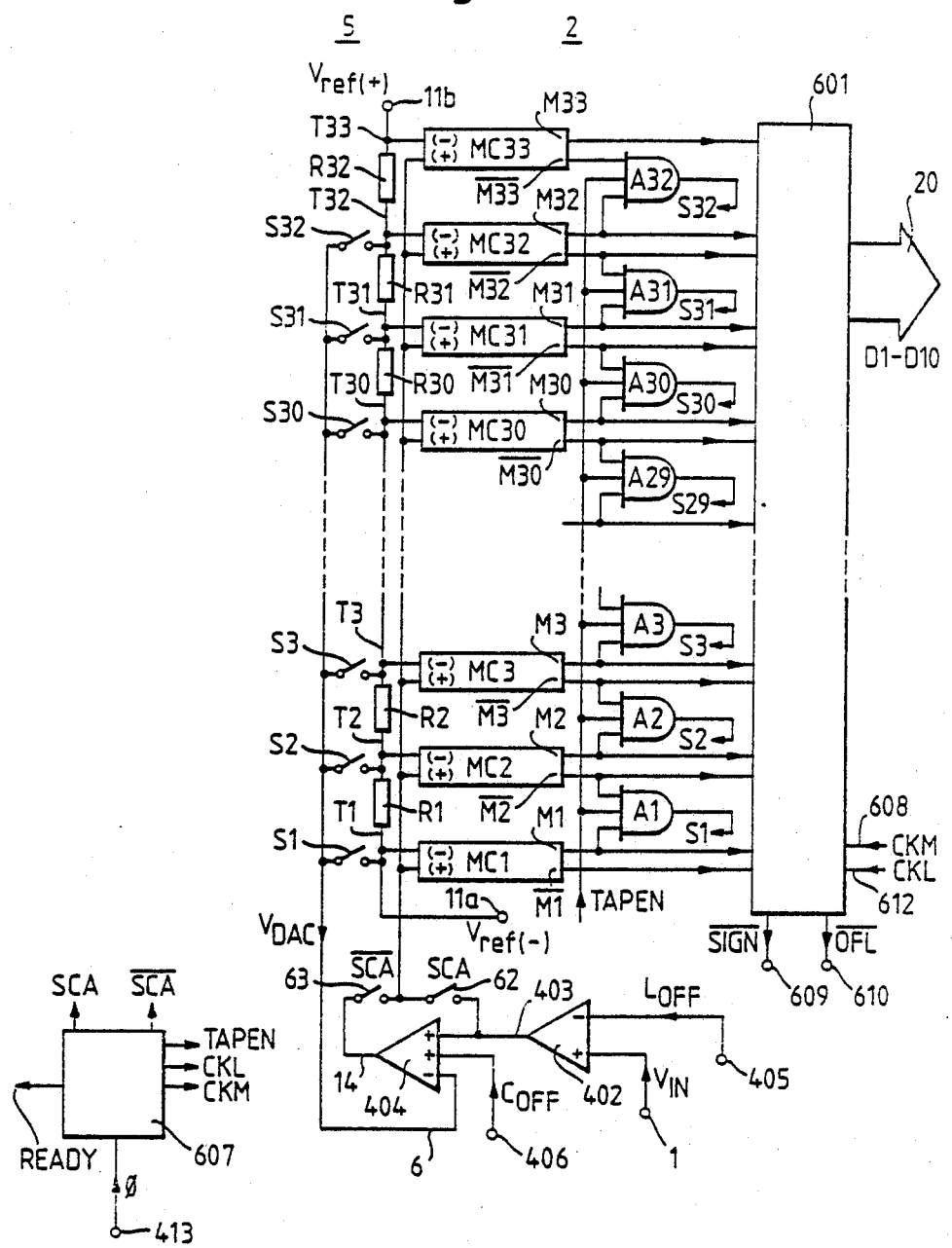
FIG. 6a is a block schematic diagram of a serial-type 10-bit half-flash ADC according to the invention.

FIG. 6a shows in block schematic form a serial type 10-bit half-flash ADC. The reference chain R1-R32, comparators MC1-MC33 and DAC 5 are all present exactly as described above with reference to FIG. 4a. MSB decoder 401 is replaced by decoder 601, which has a 10 bit output 20, outputs 609 and 610 which correspond to outputs 409 and 410 of FIG. 4a and two clock inputs 608 and 612, which are connected to outputs CKM and CKL respectively of control logic 607. Control logic 607 operates substantially as control logic 407 of FIG. 4a, but has in addition two further outputs SCA and $\overline{SCA}$.

There is no separate LSB converter. Buffer 402, amplifier 404 and terminals 1,405,406 and 413 are present as before, the only difference being that output 403 of the buffer 402 is no longer connected directly to the inputs (+) of the comparators MC1-MC33, but to a first terminal of a first switch 62. Similarly, the output 14 of scaler 404 can no longer be connected to the input of the LSB converter 8, and is instead connected to a first terminal of a second switch 63. Second terminals of switches 62 and 63 are connected in common to the input of the MSB converter 2 which, as in FIG. 4a, comprises the non-inverting inputs (+) of comparators MC1-Mc33 in common. The switches 62 and 63 are closeable electronically in response to high logic levels on respective outputs SCA and $\overline{SCA}$ of control logic 607.

The compensating feedback loops 510 and 520 are present as described above with reference to FIG. 5, and are connected to terminals 405 and 406, respectively.

Operation is similar to that of the parallel type converter of FIG. 4, the difference being that the same converter 2 is used for both the MSB and LSB conversions. Waveform diagram FIG. 6b shows how the additional signals SCA and $\overline{SCA}$ are generated as a non-overlapping, complementary pair by control logic 607 in relation to the other signals, TAPEN, CKM, CKL and READY. The reference letters A-F and L identify the major stages of the conversion for sample period T.

The MSB conversion begins, as with the parallel converter, at time A. $\overline{SCA}$ goes low to open switch 63 and then SCA goes high to close switch 62. This applies VMSB to the inputs (+) of the comparators MC1–MC33. As with the parallel converter the comparators latch their outputs and at time B, TAPEN goes high, DAC 5 is enabled, and samples of comparator outputs M17 and M34 are applied to the inputs of the low pass filters 511 and 521 (not shown). At time C CKM goes high causing MSB output signals D1–D5 to be latched onto the most significant five bits of 10-bit output 20 of decoder 601. Overflow and sign signals $\overline{OFL}$ and $\overline{SIGN}$ are also latched onto outputs 610 and 609 respectively.

At time D, amplifier 404 stores the current value of VDAC, in order to find the residue signal, VLSB, because TAPEN goes low and DAC 5 is disabled. Previously, at time L, SCA has gone low, opening switch 62 to disconnect VMSB from the comparator inputs, and $\overline{SCA}$ has gone high, closing switch 63 so that VLSB is supplied by the output 14 of scale 404 to the comparators, for the LSB conversion.

Because TAPEN remains low throughout the LSB conversion, the filters 511 and 521 do not take input from the comparator outputs M17 and M34, thereby preventing the LSB conversion from interfering with the operation of the compensation loops 510 and 520. Although VLSB may be a balanced signal, the offsets present in the LSB conversion are not generally equal to those in the MSB conversion, and are in any case 32 times less significant.

By time E, the LSB signals D6–D10 are already within the decoder 601 and CKL=1 causes them to be latched onto the least significant 5 bits of output 20. At times F, output READY goes high to indicate that output 20 carries a valid 10-bit binary signal D1–D10 representing the value of input sample VIN(T).

Meanwhile, at time A1, SCA and $\overline{SCA}$ have changed back for the MSB conversion of the nest input sample, VIN(T+1).

If more than two stages of conversion are being used, either in parallel structure with three or more flash ADC stages, or in serial mode with the same flash ADC stage being used more than twice, then a separate MSB loop is required for each stage to be compensated. In a parallel structure it may be necessary to have separate LSB loops as well, if the several arrays of comparators might be expected to develop different comparator offset voltages Vc, for example if each state comprises a separate integrated circuit.

In such converters, the control logic might generate separate enable signals for each stage, and these may be used to enable the separate filter inputs and, in the serial case, to operate sets of switches in order to switch in each loop in turn.

Of course, a single loop f the MSB loop form could be used in the LSB conversion to compensate offsets there, but the problem is less significant when there is no need to form a residue since any errors are not then amplified and passed on to a subsequent stage.

From reading the present disclosure, other modifications will be apparent to persons skilled in the art. Such modifications may involve other features which are already known in the design and use of Analogue to Digital Converters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed and whether or not it mitigates any or all of the same technical problems as does the present invention.

I claim:

1. An analogue to digital converter (ADC) for signals balanced about a datum level comprising: a first ADC stage which comprises an input for receiving a first analogue signal, means for generating one or more reference levels, a comparator for each reference level, each comparator operating to compare said first analogue signal with its reference level, said first ADC stage also comprising a digital to analogue converter for generating at its output a second analogue signal which is an analogue representation of a digital output signal of the first ADC stage; means for subtracting said second analogue signal from the first analogue signal to form a third analogue signal; means for applying the third analogue signal to an input of a further ADC stage; and means for combining the digital outputs of the ADC stages to form the digital output of the converter: characterized in that said first ADC stage further comprises means for generating a first compensating signal by forming a time-average of the output of the comparator whose reference level corresponds to the datum level, means for subtracting said first compensating signal from the first analogue signal before application of the first analogue signal to said comparators, means for adding a second compensating signal to the third analogue signal before application of the third analogue signal to the input of the further ADC stage, and means for generating the second compensating signal comprising an additional comparator having the same form as the comparator(s) of the first ADC stage and having an output connected by means of a negative feedback loop to its inverting input, and having its non-inverting input connected to the datum level.

2. An ADC as claimed in claim 1, wherein the negative feedback loop comprises a low pass filter connected between the output of the additional comparator and its inverting input.

3. An ADC as claimed in claim 1 wherein the reference one or more reference levels are voltages generated by means of taps in a resistance chain connected to at least one primary reference voltage level.

4. An ADC as claimed in claim 1 wherein the output levels of the digital to analogue converter (DAC) are derived from the same reference level or levels as are the reference levels of the first ADC stage.

5. An ADC as claimed in claim 1, wherein the DAC comprises one or more switches, one switch being connected to each reference level of the first ADC stage, and means for selectively operating one of said switches in response to the outputs of the comparators of the first ADC stage.

6. An ADC as claimed in claim 1 comprising means for amplifying the third analogue signal by $2^m$, where m is equal to the number of bits in the output of the first ADC stage, to generate the input signal for the further ADC stage, said further ADC stage operating by comparing the amplified third analogue signal with the same reference level or levels as the first ADC stage.

7. An ADC as claimed in claim 1 wherein the further ADC stage includes multiplexing means for enabling the use of the same reference levels and/or comparators as the first ADC stage.

8. An ADC as claimed in claim 1 having more than two ADC stages and comprising means for independently generating the first and/or second compensating signals for each ADC stage to which compensation is applied.

9. An ADC as claimed in claim 2 wherein the one or more reference levels are voltages generated by means of taps in a resistance chain connected to at least one primary reference voltage level.

10. An ADC as claimed in claim 2 comprising means for amplifying the third analogue signal by $2^m$ to generate the input signal for the further ADC stage, where m is equal to the number of bits in the output of the first ADC stage, said further ADC stage operating by comparing the amplified third analogue signal with said reference levels generated for the first ADC stage.

11. An analogue to digital converter (ADC) for signals balanced about a datum level comprising: a first ADC stage having an input for receiving a first analogue signal, means for generating a plurality of reference levels, a plurality of comparators comprising a comparator for each reference level and with each comparator connected to compare said first analogue signal with its reference level, said first ADC stage also comprising a digital to analogue converter responsive to a digital signal at an output of the first ADC stage for generating a second analogue signal at its output which is an analogue representation of the digital output signal of the first ADC stage, means for subtracting said second analogue signal from the first analogue signal to derive a third analogue signal, means for applying the third analogue signal to an input of a further ADC stage which derives a digital output signal representative of the third analogue signal, and means for combining the digital output signals of said first and further ADC stages to form the digital output of the converter, and means providing offset compensation comprising: means for generating a first compensating signal by forming a time-average of the output of the comparator of the first ADC stage whose reference level corresponds to the datum level, said first generating means comprising a low pass negative feedback loop that includes the datum level comparator, means for subtracting said first compensating signal from the first analogue signal before application of the first analogue signal to said comparators, means for generating a second compensating signal comprising a further comparator having a non-inverting input coupled to the datum level and a negative feedback loop coupling its output to its inverting input, and wherein the subtracting means is responsive to the first and second analogue signals and to the second compensating signal for compensating the third analogue signal before said third analogue signal is applied to the input of said further ADC stage.

12. An analogue to digital converter as claimed in claim 11 wherein said negative feedback loop of the further comparator includes a low pass filter.

13. An analogue to digital converter as claimed in claim 11 wherein the digital to analogue converter comprises output means that provide analogue output levels derived from said means for generating said plurality of reference levels for the first ADC stage.

14. An analogue to digital converter as claimed in claim 13 wherein said digital to analogue converter output means comprises a plurality of switches respectively coupling said plurality of reference levels to said subtracting means, and logic means for selectively operating one of said switches in response to output signals of the comparators of the first ADC stage.

15. An analogue to digital converter as claimed in claim 11 wherein said subtracting means comprises a difference amplifier having first, second and third inputs that receive said first analogue signal, said second analogue signal and said second compensating signal, respectively, and an output for applying said third analogue signal, compensated for offset, to said input of the further ADC stage.

* * * * *